United States Patent
Troy et al.

(10) Patent No.: US 10,800,550 B2
(45) Date of Patent: Oct. 13, 2020

(54) POSITIONING ENHANCEMENTS TO LOCALIZATION PROCESS FOR THREE-DIMENSIONAL VISUALIZATION

(71) Applicant: The Boeing Company, Chicago, IL (US)

(72) Inventors: James J. Troy, Issaquah, WA (US); Christopher D. Esposito, Issaquah, WA (US); Vladimir Karakusevic, Kirkland, WA (US)

(73) Assignee: The Boeing Company, Chicago, IL (US)

( * ) Notice: Subject to any disclaimer, the term of this patent is extended or adjusted under 35 U.S.C. 154(b) by 286 days.

(21) Appl. No.: 16/014,535

(22) Filed: Jun. 21, 2018

(65) Prior Publication Data

US 2019/0389600 A1    Dec. 26, 2019

(51) Int. Cl.
*G01N 29/04* (2006.01)
*B64F 5/60* (2017.01)
(Continued)

(52) U.S. Cl.
CPC ............... *B64F 5/60* (2017.01); *G01N 29/04* (2013.01); *G01N 29/26* (2013.01); *G01S 5/0263* (2013.01);
(Continued)

(58) Field of Classification Search
CPC ... G06T 19/003; G06T 15/20; G06T 2215/16; G06T 7/70; G06T 2219/2004;
(Continued)

(56) References Cited

U.S. PATENT DOCUMENTS

| 7,193,530 B2 * | 3/2007 | Nance ................... B64C 25/00 244/100 R |
| 7,643,893 B2 | 1/2010 | Troy et al. |

(Continued)

OTHER PUBLICATIONS

Low-Frequency Eddy-Current Testing for Detection of Subsurface Cracks in CF-188 Stub Flange; Natheer Alatawneh ; Peter Ross Underhill ; Thomas W. Krause; IEEE Sensors Journal; vol. 18, Issue: 4, IEEE Journal Article (Year: 2018).*

(Continued)

*Primary Examiner* — Cuong H Nguyen
(74) *Attorney, Agent, or Firm* — Ostrager Chong Flaherty & Broitman P.C.

(57) ABSTRACT

Apparatus and methods for displaying a three-dimensional model image of a portion of a target object. An imaging device is equipped with an inertial measurement unit (IMU) and a processor configured to execute a three-dimensional (3-D) visualization application. The IMU is used to track movement of the imaging device relative to a known initial location in a frame of reference of the target object. Imaging device position offsets are computed using relative position and orientation information acquired by a dead-reckoning process. The processor is configured to execute an algorithm that combines orientation data from the IMU with walking step information to produce a piecewise linear approximation for relative motion measurement. The resulting relative location data can then be used by the 3-D visualization application to provide an estimated 3-D viewpoint to display a 3-D model of a feature in the imaged area of interest.

24 Claims, 11 Drawing Sheets

(51) Int. Cl.
  *G01S 5/02* (2010.01)
  *G06T 19/00* (2011.01)
  *G06F 30/15* (2020.01)
  *G01N 29/26* (2006.01)
  *G01N 21/954* (2006.01)

(52) U.S. Cl.
  CPC ............ *G06F 30/15* (2020.01); *G06T 19/003* (2013.01); *G01N 21/954* (2013.01); *G05B 2219/45066* (2013.01)

(58) Field of Classification Search
  CPC ... G06T 19/00; B64F 5/00; B64F 5/40; G01S 5/0263; G01S 19/13; G06F 16/5866; G06F 30/15; G01N 29/043; G01N 2291/0258; G01N 2291/028
  USPC .......................................... 701/3; 703/1, 7, 8
  See application file for complete search history.

(56) References Cited

U.S. PATENT DOCUMENTS

| | | | |
|---|---|---|---|
| 7,813,830 B2 | 10/2010 | Summers et al. | |
| 7,859,655 B2 | 12/2010 | Troy et al. | |
| 8,044,991 B2 | 10/2011 | Lea et al. | |
| 8,199,194 B2 | 6/2012 | Troy et al. | |
| 8,249,832 B2* | 8/2012 | Motzer | G01N 21/9515 702/189 |
| 8,447,805 B2 | 5/2013 | Troy et al. | |
| 9,182,487 B2 | 11/2015 | Troy et al. | |
| 9,892,558 B2* | 2/2018 | Troy | B64F 5/40 |
| 9,952,593 B2* | 4/2018 | Colin | G05D 1/0038 |
| 10,216,765 B2* | 2/2019 | Reynertson | G06F 16/5866 |
| 2006/0220917 A1* | 10/2006 | Nance | B64C 25/00 340/960 |
| 2010/0102980 A1 | 4/2010 | Troy et al. | |
| 2011/0137615 A1* | 6/2011 | Motzer | G01N 29/2481 703/1 |
| 2012/0081540 A1* | 4/2012 | Jang | B64F 5/60 348/128 |
| 2012/0327187 A1 | 12/2012 | Troy et al. | |
| 2014/0376768 A1 | 12/2014 | Troy et al. | |
| 2015/0116481 A1 | 4/2015 | Troy et al. | |
| 2016/0117348 A1* | 4/2016 | Reynertson | G06F 16/29 707/769 |
| 2016/0264262 A1* | 9/2016 | Colin | G01N 29/04 |
| 2017/0243399 A1* | 8/2017 | Troy | G06T 19/003 |
| 2018/0292216 A1* | 10/2018 | Jimenez Gonzalez | G01S 5/0294 |
| 2018/0341811 A1* | 11/2018 | Bendale | G02B 27/0172 |
| 2018/0361571 A1* | 12/2018 | Georgeson | B25J 9/1692 |
| 2019/0389600 A1* | 12/2019 | Troy | G06T 19/003 |
| 2020/0005542 A1* | 1/2020 | Kocharlakota | G06T 19/006 |
| 2020/0111267 A1* | 4/2020 | Stauber | G06K 9/6211 |

OTHER PUBLICATIONS

Inspection of the machined features created at the embedded sensor aluminum plates; Shervin Tashakori ; Amin Baghalian ; Juan Cuervo ; Volkan Y. Senyurek ; Ibrahim N. Tansel ; Balemir Uragun; 2017 8th International Conference on Recent Advances in Space Technologies (RAST), IEEE Conference Paper. (Year: 2017).*

Extended European Search Report in European Patent Application 17155372.0 dated Apr. 7, 2017 (European counterpart of a patent application by the same inventors which is relevant to the instant patent application).

* cited by examiner

POSITIONING ENHANCEMENTS TO LOCALIZATION PROCESS FOR THREE-DIMENSIONAL VISUALIZATION

BACKGROUND

This disclosure generally relates to apparatuses and methods for determining the location of an item of interest relative to a coordinate system of a target object and then identifying that item of interest. The item of interest may be a part of the target object (hereinafter "part of interest"). The target object may be an airplane.

Situations where location and part identification data is desirable are common in applications involving inspection, maintenance, and repair of airplanes in environments such as flight line operations, airplane-on-ground events and customer walks (inspections). It is common in these situations for on-site non-expert personnel to communicate with an off-site expert analyst regarding a problem or concern. It is common practice for support personnel to take photographs of damaged locations. Based on these photographs, an on-site or off-site expert analyst may attempt to define where the damage is located by visually comparing the image of the damaged location with available technical data such as drawings, 3-D models, manual illustrations and similar documentation. This gives a subjective indication of the location reference of the damaged location relative to a target object. Based on this location, analysis is conducted with a high probability of location error.

The communication of information by an on-site technician may include the transmission of digital photographs of the area of interest to the off-site expert analyst using a smartphone, digital camera, tablet, laptop, notebook personal computer (PC), or other hand-held (i.e., mobile) imaging device. U.S. Pat. No. 9,892,558 discloses a method for identifying parts of a target object (e.g., an airplane) using geotagged photographs captured on site by a GPS-equipped imaging device. The geotagged photographs contain GPS location data and camera setting information. The embedded image metadata from two or more photographs is used to estimate the location of the imaging device relative to the target object, which location is defined in the coordinate system of the target object. Once the coordinates of the area of interest on the target object are known, the part number and other information associated with the part can be determined when the imaging device viewpoint information is provided to a three-dimensional (3-D) visualization environment that has access to 3-D models of the target object. However, the method disclosed in U.S. Pat. No. 9,892,558 may be unsuitable for environments, such as some indoor environments, which do not have GPS coverage.

It would be advantageous to provide an apparatus and a method capable of identifying parts of target objects based on photographs of areas of interest using a hand-held imaging device in an environment that has limited or no GPS coverage.

SUMMARY

The subject matter disclosed in detail below is directed to apparatuses and methods for displaying a three-dimensional model image of a portion of a target object corresponding to a captured image of an area on the target object that includes a part of interest and then identifying the part of interest (e.g., using an alphanumeric designation). The apparatus is an imaging device equipped with an inertial measurement unit (IMU) and a processor configured with a 3-D visualization application. The IMU is used to track movement of the imaging device relative to a known initial location. Imaging device position offsets are computed using relative position and orientation information acquired by a dead-reckoning process running on the IMU-equipped imaging device. The imaging device processor is configured to execute an algorithm that combines orientation data from the IMU with walking step information to produce a piecewise linear approximation for relative motion measurement. The method also includes a process to correct the final location and provide feedback to the mathematical model of the dead-reckoning process for improving future position estimation.

To avoid confusion with the term "process step," a step taken by a user during a walk will be referred to herein as a "walking step." The length of a walking step will be referred to herein as the "step length." The number of consecutive walking steps will be referred to herein as the "step count." The number of walking steps per unit of time will be referred to herein as the "step frequency."

Although various embodiments of an imaging device equipped with an IMU and a processor configured with a 3-D visualization application for identifying parts of a target object will be described in some detail below, one or more of those embodiments and other embodiments not specifically disclosed may be characterized by one or more of the following aspects.

One aspect of the subject matter disclosed in detail below is a method for displaying a three-dimensional model image of a portion of a target object, comprising: (a) carrying an imaging device from an initial location that is known in a frame of reference of the target object to a subsequent location that is not known in the frame of reference of the target object while walking along a path, wherein an area on the target object including a part of interest is in the field-of-view of the imaging device when the imaging device is at the subsequent location; (b) acquiring orientation data representing an orientation of the imaging device during walking along the path using an inertial measurement unit incorporated in the imaging device; (c) acquiring vertical acceleration data during walking along the path using the inertial measurement unit; (d) counting the number of walking steps taken during walking along the path by detecting a repeating characteristic of the vertical acceleration data; (e) calculating a current position and a current orientation for the subsequent location of the imaging device relative to the frame of reference of the target object using the orientation data, the number of walking steps, and a step length; and (f) displaying a three-dimensional model image of at least a portion of the target object with a viewpoint that is a function of the calculated current position and current orientation of the imaging device.

Another aspect of the subject matter disclosed in detail below is a method for identifying a part of a target object, comprising: (a) carrying an imaging device from an initial location that is known in a frame of reference of the target object to a subsequent location that is not known in the frame of reference of the target object while walking along a path, wherein an area on the target object including a part of interest is in the field-of-view of the imaging device when the imaging device is at the subsequent location; (b) executing a dead-reckoning algorithm that combines orientation data from an inertial measurement unit incorporated in the imaging device with walking step information to produce a piecewise linear approximation of the path for measurement of the motion of the imaging device relative to the initial location; (c) calculating a current position and a current orientation for the subsequent location of the imaging device relative to the frame of reference of the target object using the measurement of the motion of the imaging device relative to the initial location; (d) displaying a three-dimensional model image of at least a portion of the target object with a viewpoint that is a function of the calculated current position and current orientation of the imaging device; (e) selecting a point in a portion of the displayed three-dimensional model image that depicts the part of interest; (f) retrieving part identification data from a three-dimensional model database corresponding to the part of interest selected; and (g) displaying alphanumeric symbology that depicts the identity of the part contained in the retrieved part identification data.

A further aspect of the subject matter disclosed in detail below is an apparatus comprising a digital camera, an inertial measurement unit, a display screen, a non-transitory tangible computer-readable storage medium storing three-dimensional model data of a target object, a three-dimensional visualization software application, and a dead-reckoning algorithm, and a processor configured to perform the following operations: (a) counting the number of walking steps taken by a user carrying the apparatus during walking along a path from an initial location to a subsequent location by detecting a repeating characteristic of vertical acceleration data acquired by the inertial measurement unit; (b) calculating a current position and a current orientation for the subsequent location of the digital camera relative to the frame of reference of the target object using the dead-reckoning algorithm, orientation data acquired by the inertial measurement unit, the number of walking steps, and a step length; (c) retrieving the three-dimensional model data of the target object from the non-transitory tangible computer-readable storage medium; and (d) using the three-dimensional visualization software application to control the display screen to display a three-dimensional model image of at least a portion of the target object with a viewpoint that is a function of the calculated current position and current orientation of the imaging device, the three-dimensional model image depicting three-dimensional model data retrieved from the three-dimensional model database.

Other aspects of apparatuses and methods for displaying a three-dimensional model image of a portion of a target object and for identifying parts visible in a captured image of an area of interest on a target object are disclosed below.

BRIEF DESCRIPTION OF THE DRAWINGS

The features, functions and advantages discussed in the preceding or following sections may be achieved independently in various embodiments or may be combined in yet other embodiments. Various embodiments will be hereinafter described with reference to drawings for the purpose of illustrating the above-described and other aspects.

Reference will hereinafter be made to the drawings in which similar elements in different drawings bear the same reference numerals.

DETAILED DESCRIPTION

Figure 1:
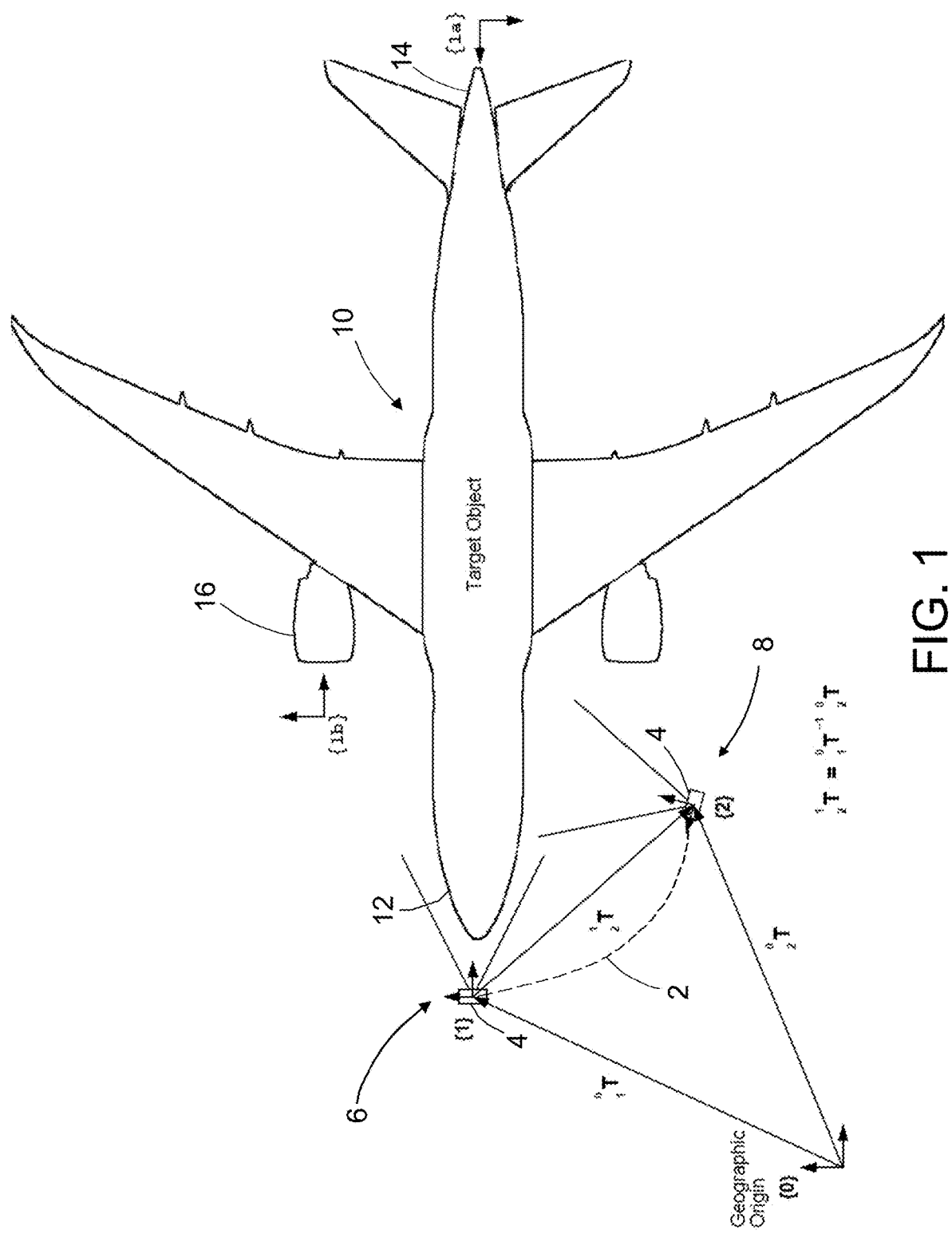
FIG. 1 shows an airplane in relation to an initial location of a hand-held imaging device for capturing a reference image of the airplane and a subsequent location for capturing an image of a feature or part of interest on the airplane in accordance with one embodiment of the process disclosed herein.

Illustrative embodiments of apparatus and methods for displaying a three-dimensional model image of a portion of a target object and for identifying parts visible in a captured image of an area of interest on a target object are described in some detail below. However, not all features of an actual implementation are described in this specification. A person skilled in the art will appreciate that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

It is common practice during airplane maintenance operations that on-site maintenance personnel communicate with an off-site expert, including sending digital photographs of an area of interest (e.g., a portion of an airplane and, more specifically, a damaged portion of an airplane), captured using an imaging device of consumer type, such as mobile phones and tablet computers. For the purpose of illustration, methods for determining 3-D coordinates and identifying parts of interest on an airplane will be described in detail below. However, the concept of determining 3-D coordinates and identifying parts of a target object using an IMU-equipped imaging device and 3-D visualization can also be used for determining 3-D coordinates and identifying parts of structures other than airplanes.

It is common for hand-held imaging devices to have an integrated GPS receiver, which enables the inclusion of geographical identification data into the digital image metadata fields (usually in the standard EXIF format). The integration of this type of data within a digital image (referred to herein as "geotagging") can be very useful in locating, in terms of latitude and longitude (and optionally altitude), where a photograph was taken. The hand-held imaging device may also incorporate a gyroscope to get a relative heading angle of the imaging device.

The subject matter disclosed in detail below is directed to apparatuses and methods for identifying parts visible in a captured image of an area of interest on a target object using photographs captured on site by a self-contained hand-held imaging device. The apparatus is an imaging device equipped with an inertial measurement unit (IMU) and a processor configured with a 3-D visualization application. The IMU is used to track movement of the imaging device relative to a known initial location. The processor computes imaging device position offsets using relative position and orientation information acquired by a dead-reckoning process running on the IMU-equipped imaging device. In accordance with the embodiments disclosed herein, the imaging device processor is configured to execute an algorithm that combines orientation data from an IMU with walking step information to produce a piecewise linear approximation for relative motion measurement. The method also includes a process to correct the final location and provide feedback to the mathematical model of the dead-reckoning process for improving future position estimation.

The system disclosed herein provides a solution to acquiring short- to medium-range position information without dependence on GPS. It can be a tablet or smartphone-based solution that uses dead-reckoning, with step count, step length, and IMU orientation to get an approximation of the location difference between a first relative camera location (relative to the target object) where a reference image of the target object was captured and a second relative camera location where a second image of the target object was captured. The dead-reckoning process, disclosed in some detail below, enables the acquisition of position information of a part relative to the frame of reference (e.g., in the coordinate system) of the target object. An additional visual alignment step with the 3-D model (described in some detail below) at the end of the process provides feedback to the dead-reckoning method to improve future usage of the method (e.g., adapting the positioning model to produce better results). Using standard double-integration methods, IMUs do not produce accurate position data due to accelerometer drift, but using the accelerometer part of the IMU just to count steps of the user walking from point A to point B, and the orientation data to provide direction, one can produce a reasonable solution for short- to medium-range relative motion that uses smartphone hardware. The apparatus and method proposed herein is sufficiently accurate at short to medium ranges (e.g., less than 200 feet) and works indoors as well as outdoors.

The IMU incorporated in the imaging device detects the up-down motion of the user who is carrying the imaging device as the user takes each walking step. The processor incorporated in the imaging device is configured to sum the number of up-down movements and then multiply the sum by an assumed step length. Thus, the IMU and processor provide the functionality of a pedometer. The user calibrates the pedometer by walking a measured distance and then manually entering that distance into the hand-held imaging device. The pedometer function maintains a simple walking step model for the user, which model may be recalibrated when a different user with a different walking gait carries the imaging device.

Alternatively, user identification can be used as part of a scheme to store user-specific data (e.g., step length, frequency, etc.) as part of user profiles that can reside in a non-transitory tangible computer-readable storage medium incorporated in the imaging device. This would eliminate any need to recalibrate the walking model when a different user picks up the device. In response to recognition of the user by the imaging device, the walking parameters from the identified user's profile would be retrieved for use in the relative localization process.

The overall process described below enables image data and metadata, captured on-site by non-expert personnel using an IMU-equipped imaging device, to be used by on-site or off-site analysts for the determination of 3-D coordinates. The process involves the use of common IMU-equipped imaging devices to acquire reference and feature digital photographs with embedded metadata (that includes relative location and camera settings). The metadata can be used to generate relative Cartesian (X, Y, Z) location (position and orientation) information that can be transformed into the native local coordinate system of the target object. The process has a real-time mode that is constantly updating the approximate current location on the imaging device, which can be used by the 3-D visualization application to show a live update of the virtual location on the display screen of the imaging device. This update is only an approximation since a final correction step has not been performed, but such real-time updating can be useful in some conditions to give situational awareness to the user while moving.

The computed location data may also be used by a 3-D visualization application with access to a 3-D model (e.g., a CAD model) of the target object to provide an estimated 3-D viewpoint in order to display a 3-D model of a feature in the imaged area of interest. Using the feature digital photograph as a background or overlay image in the 3-D visualization environment allows this estimated viewpoint to be further refined (if necessary) using interactive or automatic adjustment. The coordinates of the feature in the area of interest can be determined, and the identities (part numbers, etc.) of items or parts of interest can then be extracted from the 3-D model of the target object (e.g., an airplane). For example, the modeling software module may include the ability to display the name of the associated part when a particular position on the displayed image of the airplane is selected (e.g., by touching/tapping the display screen with a finger/stylus or pointing at that position using a cursor).

A process for identifying parts of an airplane at a site using an IMU-equipped imaging device will now be described in detail for the purpose of illustration. However, it should be appreciated that the concept embodied in such process can also be used to identify parts on a target object other than an airplane.

Prior to use of the IMU-equipped imaging device, the device (or more specifically, the walking modeling method) must be calibrated. In this case, the only calibration needed is to determine the average step length of the user who will be carrying the imaging device during image capture at different locations. This can be done by counting the number of walking steps taken by the user while walking in a straight line for a known distance. The processor incorporated in the imaging device may be configured to calculate an average step length. The average step length will equal the known distance divided by the number of walking steps. This average step length is entered into a non-transitory tangible computer-readable storage medium incorporated in the imaging device by the user.

FIG. 1 shows an airplane 10 in relation to respective locations of a hand-held imaging device 4. The pairs of orthogonal arrows located at the vertices of the triangle in the lower left-hand portion of FIG. 1 represent respective coordinate frames of reference, including: a coordinate system {0} (e.g., an Earth-centered coordinate system) having a geographic origin; a coordinate system {1} of the hand-held imaging device 4 having an origin positioned at a known reference location (referred to hereinafter as the "initial location 6"), such as the origin of the airplane coordinate system (which origin may be located a certain distance in front of the nose 12 of the airplane 10 or elsewhere), and having an axis aligned with one axis of the airplane coordinate system; and a coordinate system {2} of the hand-held imaging device 4 having an origin positioned at an unknown location (referred to hereinafter as the "subsequent location 8") relative to the airplane coordinate system and an axis having an unknown orientation relative to the airplane coordinate system.

Referring to FIG. 1, the process in accordance with one embodiment begins at the physical location of the airplane 10. An on-site maintenance person (not shown in FIG. 1) can use the imaging device 4 at the initial location 6 to capture a digital photograph representing a reference image of the airplane 10. In the scenario depicted in FIG. 1, the initial location 6 is near the nose 12 of the airplane 10. Other easily identifiable areas such as the tail 14 or engine 16 may also be used for reference purposes, in which cases the initial location would be respectively located near the tail 14 or near the engine 16. The coordinate systems (i.e., frames of reference) having origins at such alternate initial locations and an axis aligned with an axis of the airplane coordinate system are respectively labeled {1a} and {1b} in FIG. 1.

Applying the foregoing conventions, FIG. 1 shows an airplane 10 in relation to an initial location 6 of a hand-held IMU-equipped imaging device 4 for capturing a reference image of the airplane 10 during a calibration procedure and a subsequent location 8 for capturing an image of a feature or part of interest on the airplane 10 after calibration in accordance with one embodiment of the process disclosed herein. In this example, the imaging device 4 was carried by a user (e.g., an on-site maintenance personnel not shown in FIG. 1) who walked along path 2 (indicated by a curved dashed line in FIG. 1) in a substantially horizontal plane that connects the initial location 6 and the subsequent location 8. Preferably the user holds the imaging device 4 in a steady position relative to the body of the user so that the imaging device 4 moves in unison with the center of mass of the user as the user walks along the horizontal path 2. The initial location 6 may correspond to an origin positioned at a known location, such as the origin of the airplane coordinate system (which origin may be located a certain distance in front of the nose 12 of the airplane 10 or elsewhere), and having axes aligned with the axes of the airplane coordinate system. The position and orientation of the imaging device 4 at the subsequent location 8 relative to the airplane coordinate system are determined using the technology disclosed herein.

During reference image capture, a processor inside the imaging device 4 is configured to record the known coordinates of the initial location 6 (previously inputted into the imaging device by the user), the camera heading (aim direction, measured by gyroscopes incorporated in the IMU, with optional correction from a magnetometer), and camera settings (including the lens field-of-view or zoom angle) into the metadata portion of the digital photograph's file structure. On many of the current imaging devices, this metadata is stored in EXIF format, but the method can be modified to work with other formats as well.

After the reference image has been captured, the user turns and walks along the horizontal path 2, stops at the subsequent location 8, aims the imaging device 4 at an area of interest on the airplane 10, and then uses the imaging device 4 to capture one or more additional digital photographs of feature(s) or part(s) in that area of interest. In this case the processor inside the imaging device 4 records digital data representing the camera heading measured by the IMU, digital data representing the number of walking steps taken by the user (derived from IMU accelerometer measurements) and digital data representing the camera settings in the metadata fields of respective digital image files.

Figure 2:
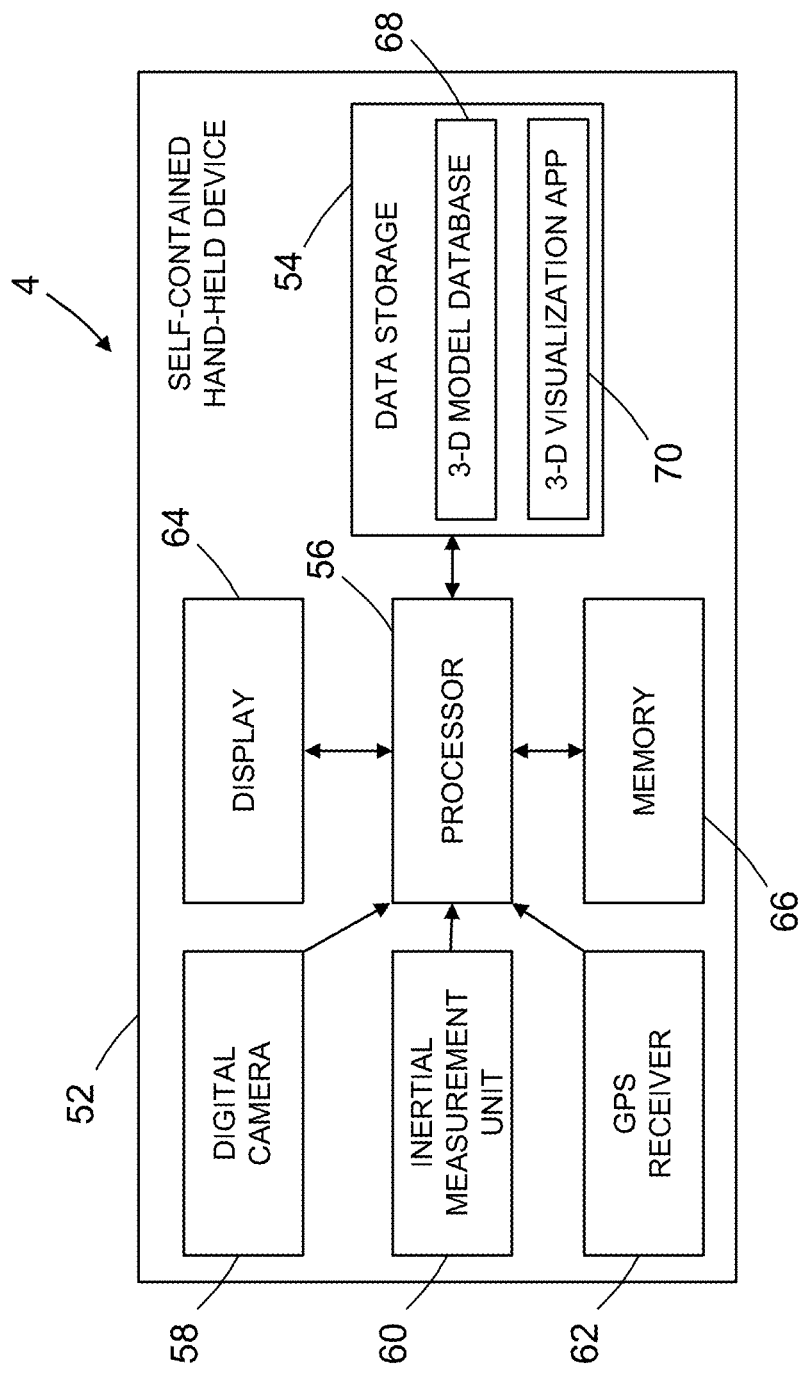
FIG. 2 is a block diagram identifying major components of a self-contained, IMU-equipped imaging device configured with a 3-D visualization software application in accordance with one embodiment.

FIG. 2 is a block diagram identifying major components of a self-contained, IMU-equipped imaging device 4 configured with a 3-D visualization software application in accordance with one embodiment. The imaging device 4 may take the form of a tablet PC or a smartphone capable of acquiring IMU data, image data, and interacting with 3-D models. The major components of imaging device 4 include a housing 52 supporting the following additional components: data storage 54, a processor 56, a digital camera 58, an IMU 60 having a three-axis gyroscope (and optionally a magnetometer), a GPS receiver 62 (not used in the dead-reckoning method disclosed herein), a touch-enabled display screen 64, and working memory 66. The data storage 54 is a non-transitory tangible computer-readable storage medium of any suitable type, such as a random access memory chip. The contents of data storage 54 comprise a 3-D model database 68 and a 3-D visualization application 70. The processor 56 receives image data from the digital camera 58 and heading angle and vertical acceleration data from the IMU 60. In the embodiment depicted in FIG. 2, the software for computing the offset transformation matrix is embedded in the 3-D visualization application 70. The processor 56 computes the offset transformation matrix using the vertical acceleration and heading angle data and the average step length. That offset transformation matrix is then used to provide an initial viewpoint in the 3-D visualization environment displayed on display screen 64. If that initial viewpoint results in a feature image that is not aligned with the 3-D model image of the target object, the expert analyst may manually make small adjustments until the feature image is properly registered with the 3-D model image.

An IMU is an electronic device that measures and reports a body's specific force, angular rate, and sometimes the magnetic field surrounding the body, using a combination of accelerometers and gyroscopes, sometimes also magnetometers. It is common for hand-held imaging devices to have an IMU, which is typically configured to measure linear acceleration along one or more axes and rate of rotation about one or more axes. Preferably the IMU 60 includes three accelerometers for periodically or continuously measuring linear acceleration along three mutually orthogonal axes and a three-axis gyroscope for periodically or continuously measuring the rate of rotation about three mutually orthogonal axes. Together these sensors provide six-component motion sensing: linear acceleration for X, Y and Z movement and angle and rate of rotation in space (roll, pitch and yaw). The accelerometers and three-axis gyroscope may be incorporated in an integrated circuit printed on a chip. The IMU 60 may also incorporate a digital compass (e.g., a miniaturized magnetometer incorporated in an integrated circuit), which enables the aim direction (i.e., heading) relative to the earth's magnetic field of the imaging device 4 to be determined.

The data from the IMU 60 is used to determine the location of the imaging device 4 where an image of an area of interest on the target object has been captured. Referring again to FIG. 1, a reference image of the airplane 10 is captured while the imaging device 4 is at the initial location 6, which has a known position and known orientation relative to the target object. The coordinate position of the initial location 6 is given in the coordinate system of the airplane 10. Then, the imaging device 4 is moved to a subsequent location 8 where an area of interest on the airplane 10 is within the field of view of the imaging device 4. Measurement data acquired by the IMU 60 while the imaging device 4 is being carried from the initial location 6 to the subsequent location 8 is used to estimate the position and orientation of the imaging device 4 relative to the airplane 10. The coordinate position of the subsequent location 8 is also given in the coordinate system of the airplane 10. The position and orientation of the imaging device 4 at the subsequent location 8 are then used by the 3-D visualization application 70 to update the virtual viewpoint defined in the coordinate system of the airplane 10. In addition, while the user is walking, an approximate (uncorrected) viewpoint may be updated in real-time in the virtual environment based on the continuously computed dead-reckoning location.

Figure 3A:
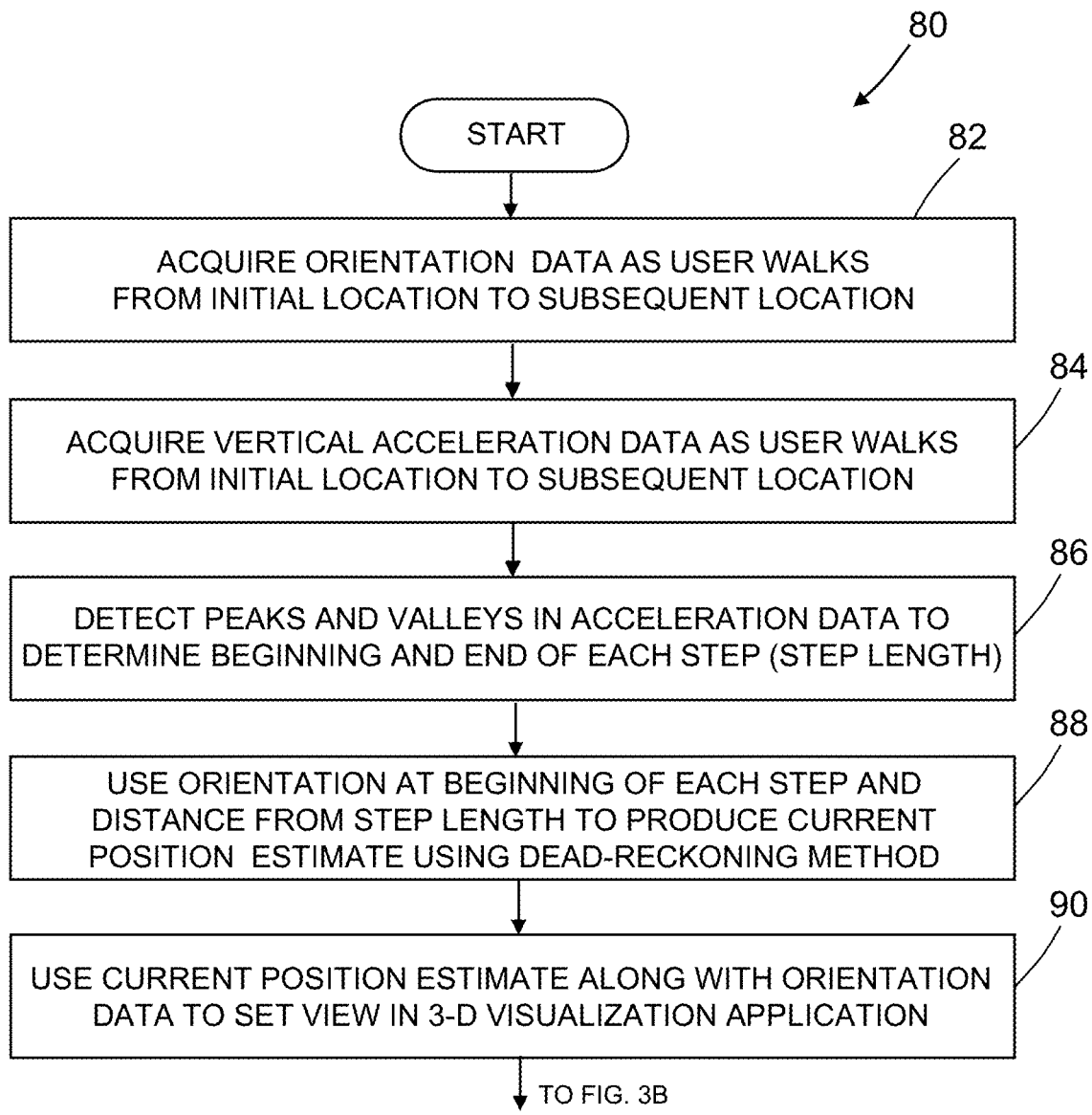
FIGS. 3A and 3B present respective portions of a flowchart identifying steps of a method 80 for identifying a part of interest in a target object.
Figure 3B:
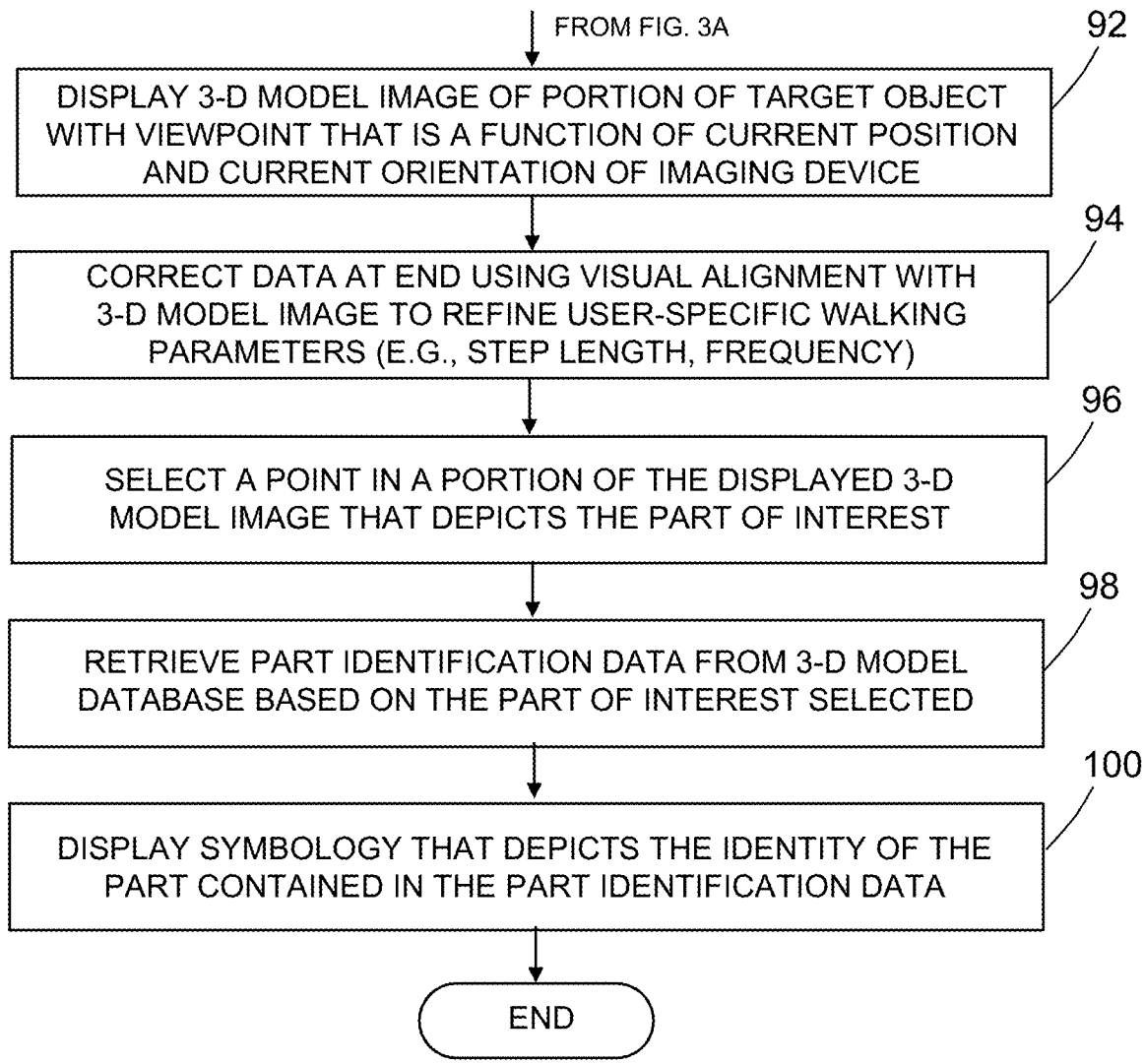
Figure 4:
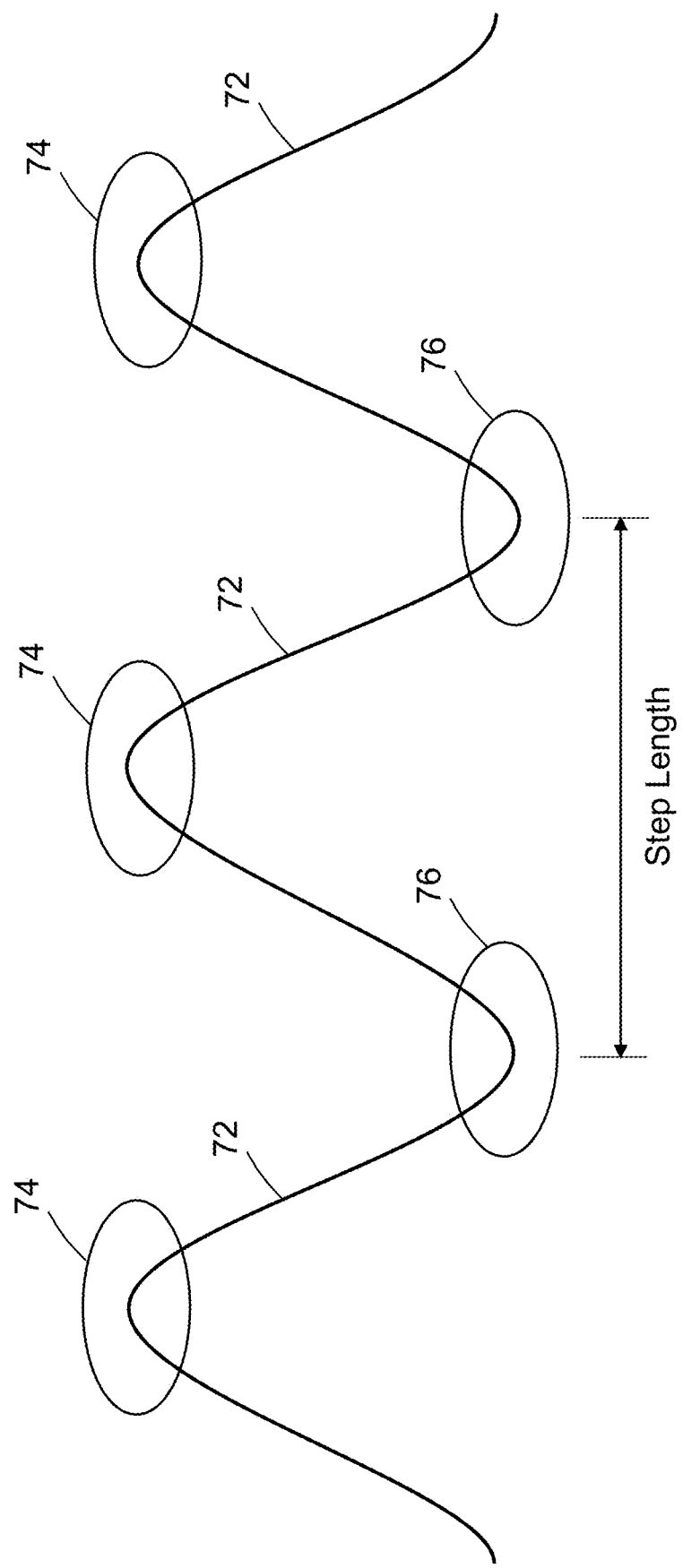
FIG. 4 is a diagram showing a vertical path of a center of mass of a user as the user takes three walking steps.
Figure 5A:
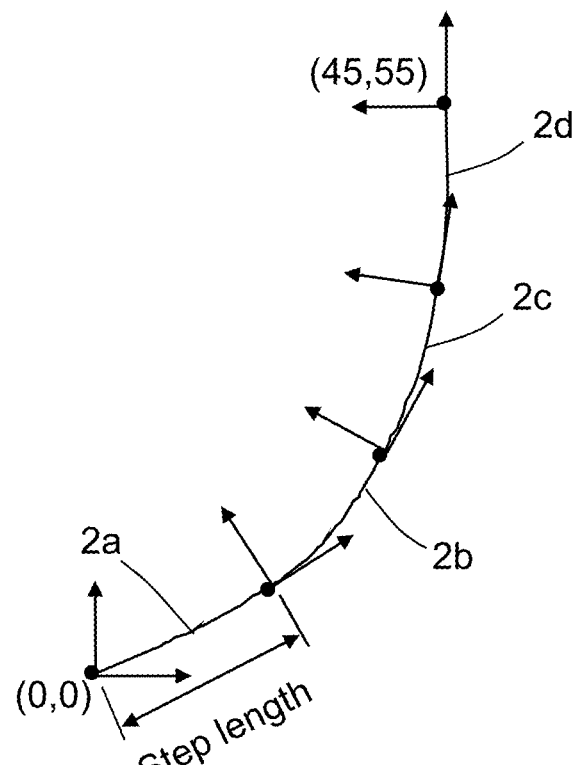
FIG. 5A is a diagram showing a mapping of a horizontal path of a center of mass of a user as the user takes four walking steps while changing direction.
Figure 5B:
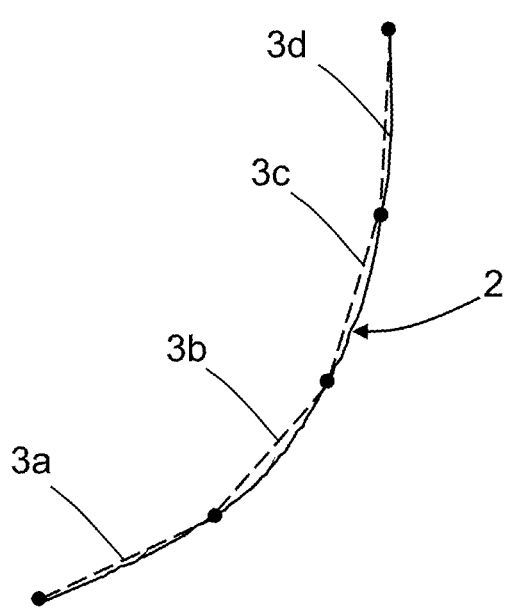
FIG. 5B is a diagram showing a piecewise linear approximation of the path depicted in FIG. 5A, which piecewise linear approximation is used for relative motion measurement.

FIGS. 3A and 3B present respective portions of a flowchart identifying steps of a method 80 for identifying a part of interest in a target object. Method 80 includes a process for determining a subsequent location 8 of the imaging device 4 relative to an initial location 6 following a walk by a person (hereinafter "user") who was carrying the imaging device 4 during the walk. The steps of method 80 will now be described with occasional references to FIGS. 4, 5A and 5B. FIG. 4 shows a typical vertical path 72 traveled by the IMU 60 as the user takes three walking steps. FIG. 5A is a diagram showing a mapping of a horizontal path of a center of mass of a user as the user takes four walking steps while changing direction. FIG. 5B is a diagram showing a piecewise linear approximation of the path depicted in FIG. 5A, which piecewise linear approximation is used for relative motion measurement. Making the assumption that the user holds the IMU 60 at a fixed distance from the user's center of mass, then the path traveled by the IMU 60 also represents the path of travel of the center of mass of the user during walking.

The methodology described below includes calibration of the imaging device to store a user-specific walking step length, which step length is used to determine the position offset of the subsequent location relative to the initial location. In accordance with one embodiment, the calibration procedure includes the following steps: (a) carrying the imaging device while walking along a substantially straight path having a known length; (b) continuously acquiring vertical acceleration data during walking along the straight path using the inertial measurement unit; (c) counting the number of walking steps taken during walking along the straight path by detecting a repeating characteristic of the vertical acceleration data; (d) calculating the step length by dividing the known length by the number of walking steps counted in step (c); and (e) storing the step length in a non-transitory tangible computer-readable storage medium.

Following each calibration by a different user, the user-specific data (e.g., step length, frequency, etc.) for each different user may be stored in a database of user profiles that can reside in a non-transitory tangible computer-readable storage medium. This eliminates any need to recalibrate the walking model when a different user picks up the device. In response to recognition of a particular user by the imaging device, the walking parameters from that particular user's profile are retrieved for use in the relative localization process. Other ways for enabling a user to retrieve a pre-stored user profile may be employed.

After the imaging device 4 has been calibrated, the method shown in FIGS. 3A and 3B is performed. Referring first to FIG. 3A, the gyroscope of the IMU 60 is used to continuously acquire orientation data which can be sampled for use in determining the relative position coordinates and orientation (in the frame of reference of the airplane 10) of the imaging device 4 when the imaging device 4 is situated at the subsequent location 8. In accordance with the embodiments disclosed herein, the orientation data is sampled to extract orientation data acquired at the beginning of each walking step taken by the user while walking from the initial location 6 to the subsequent location 8 (step 82 of method 80). The processor 56 of the imaging device 4 is configured to collect and process the orientation data from the IMU. FIG. 5A shows a respective pair of mutually orthogonal arrows representing the orientation of the IMU (and the imaging device 4) at the start of each of four walking steps, the starting point of each walking step being represented by a respective solid dot and each segment of the path traveled by the IMU 60 during each walking step being represented by a respective curved solid line. The successive path segments in this example are respectively labeled 2a, 2b, 2c and 2d (hereinafter "path segments 2a-2d") in FIG. 5A. Had the user walked in a straight line, then the measured orientation would be constant. In the example shown in FIG. 5A, in which the user has walked along a curved path, the orientation has changed with each walking step.

At the same time that orientation data is being acquired, the IMU 60 is also continuously acquiring vertical acceleration data, which vertical acceleration data is filtered to reduce signal noise and analyzed to detect the instants in time when the vertical acceleration is a maximum and above a threshold value, which corresponds to the start of a walking step, or when the vertical acceleration is a minimum and below a threshold value, which corresponds to the end of a walking step (e.g., foot contact with the ground). The processor 56 is configured to correlate the maximum or minimum acceleration data with the orientation data acquired at the same instants in time.

Referring again to FIG. 3A, as the user walks along the horizontal path 2 from the initial location 6 to the subsequent location 8, the IMU 60 detects the vertical acceleration of the imaging device (step 84 of method 80). The processor 56 of the imaging device 4 is configured to continuous collect and process the vertical acceleration data from the IMU 60. More specifically, the processor 56 is configured to detect the minimum and maximum vertical acceleration to determine the beginning and end of each walking step (step 86 of method 80). Due to the initial calibration, the step length of the user has already been recorded and resides in data storage 54 of the imaging device 4. Having made the assumption that the user is holding the IMU 60 at a fixed location from the user's center of mass, then the vertical path 72 (see FIG. 4) also represents the vertical path of travel of the center of mass of the user during walking. This vertical path 72 may be approximately sinusoidal. It should be appreciated that steps 82, 84 and 86 of method 80 are performed for each walking step taken by the user.

For each walking step, the minimum vertical acceleration (i.e., the maximum vertical deceleration) occurs in the regions of vertical path 72 inside the ellipses 74 seen in FIG. 4. Conversely, for each walking step the maximum vertical acceleration occurs in the regions of vertical path 72 inside the ellipses 76 seen in FIG. 4. For any walking step taken by the user, the walking step starts at the point where the vertical acceleration is a maximum (corresponding to a valley in the vertical profile 72), continues through the point where the vertical acceleration is a minimum (corresponding to a peak in the vertical profile 72), and then ends at the next point where the vertical acceleration is again a maximum (corresponding to another valley in the vertical profile 72). As indicated in FIG. 4, the horizontal distance between successive valleys in the vertical path 72 is the step length.

Referring again to FIG. 3A, the processor 56 of the imaging device 4 is further configured to process the vertical acceleration and orientation data from the IMU 60 and the known step length retrieved from data storage 54 to produce a current position estimate using a dead-reckoning algorithm (step 88 of method 80). In navigation, dead reckoning is the process of calculating one's current position relative to a previously determined position by tracking incremental movements. More specifically, the processor 56 computes imaging device X and Y coordinate position offsets (hereinafter "X and Y position offsets 6") using relative position and orientation information acquired by the dead-reckoning algorithm. In the example depicted in FIG. 5A, assuming that the X and Y coordinates of an initial location are (0, 0), after four steps the X and Y coordinates of a subsequent location are (45, 55), meaning that the X position offset is 45 and the Y position offset in 55.

In accordance with the embodiments disclosed herein, the processor 56 is configured to execute a dead-reckoning algorithm that combines orientation data from the IMU 60 with walking step information to produce a piecewise linear approximation for relative motion measurement. FIG. 5B shows such the piecewise linear approximation of the horizontal path 2 depicted in FIG. 5A, which horizontal path consists of four individual curved path segments 2a-2d. In mathematics, a piecewise linear function is a real-valued function whose graph is composed of straight-line sections. FIG. 5B shows four straight-line sections 3a-3d (indicated by respective dashed lines) which connect respective pairs of step starting points. The processor 56 is configured to compute the X and Y position offsets based on the orientation (i.e., angle) of the imaging device 4 at each starting point and the known step length using an algorithm that either performs trigonometric calculations or retrieves trigonometric calculation results from a look-up data table stored in data storage 54.

Referring again to FIG. 3A, the processor 56 is further configured to convert the X and Y position offsets to the coordinate position of the imaging device 4 in the frame of reference of the airplane 10. In addition, since the orientation of the airplane 10 in a global frame of reference is known from previous measurement(s) and the current orientation of the imaging device 4 in the same global frame of reference has now been measured, the orientation of the imaging device 4 relative to the airplane 10 can be determined. This relative location data, which is defined in the coordinate system of the airplane (or other target object), is then used by a 3-D visualization application to set position and orientation of a virtual viewpoint (step 90 of method 80), along with the field-of-view setting of the imaging device from the feature image metadata (recall that the "feature image" is the image of the area of interest captured by the imaging device 4 while at the subsequent location 8 shown in FIG. 1).

Referring now to FIG. 3B, the processor 56 is further configured to control the display device 64 to display a three-dimensional model image of at least a portion of the target object with a viewpoint that is a function of the current position and current orientation of the imaging device 4 (step 92 of method 80). The method 80 also includes a process to correct the data (if needed) representing the subsequent location 8 and provide feedback to the mathematical model of the dead-reckoning process for improving future position estimation, e.g., by refining user-specific walking parameters such as step length and frequency (step 94 of method 80). More specifically, the relative location of the imaging device 4 may be further refined using interactive or automatic alignment of the photographic image and the 3-D model image to determine precise coordinates of the area of interest.

Once the coordinates of the area of interest on the airplane 10 are known, the identity (e.g., part number) and other information associated with a part in the area of interest can be determined. More specifically, the imaging device viewpoint information is provided to a 3-D visualization application 70 that has access to 3-D models of the airplane 10 in 3-D model database 68, from which the part number can be extracted. This easy-to-use process can assist support and services personnel in determining the information needed to assess potential damage to the airplane 10 in the appropriate context. First, the user selects a point in a portion of the displayed three-dimensional model image that depicts the part of interest (step 96 of method 80), for example, by the user touching the display screen with a pointer or finger. In response to that selection, the processor 56 retrieves part identification data from the three-dimensional model database 68 corresponding to the selected part of interest (step 98 of method 80). The processor 56 is further configured to control the display device 64 to display alphanumeric symbology that depicts the identity of the part contained in the retrieved part identification data (step 100 of method 80).

In accordance with some embodiments, all of the data processing steps described with reference to FIGS. 3A and 3B are performed by the processor 56 of the imaging device 4. In accordance with alternative embodiments, all of the data processing steps described with reference to FIGS. 3A and 3B are performed by a computer system housed in a maintenance operations center (or some other location) at a site some distance from the site of the airplane 10. To facilitate implementation of such alternative embodiments, it is well known to provide the imaging device and the external computer system with respective transceivers and antennas for enabling wireless communication therebetween.

Figure 6A:
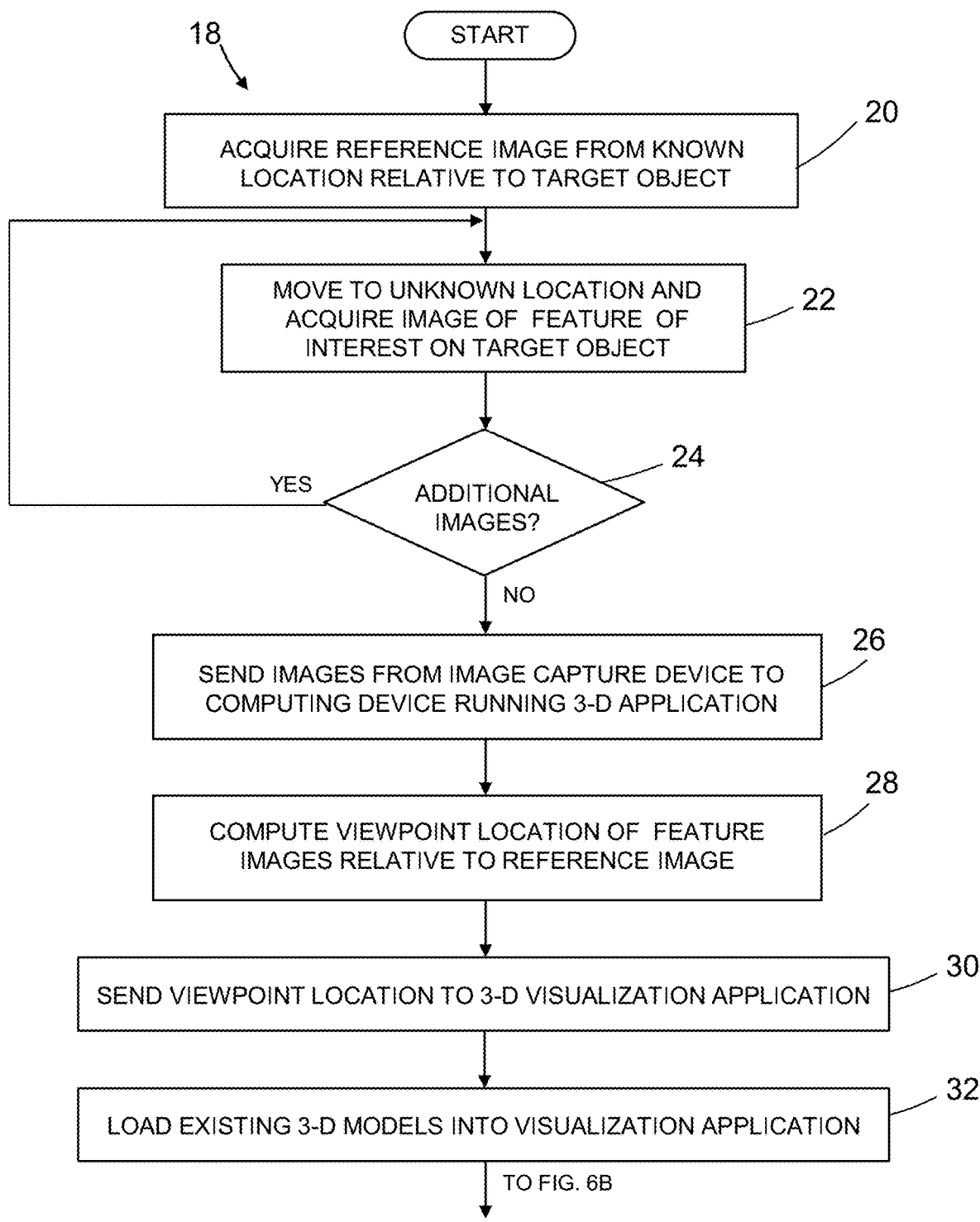
FIGS. 6A and 6B present respective portions of a flowchart identifying steps of a process for identifying a part of a target object using 3-D visualization, 3-D model data, and photographs captured using an IMU-equipped imaging device.
Figure 6B:
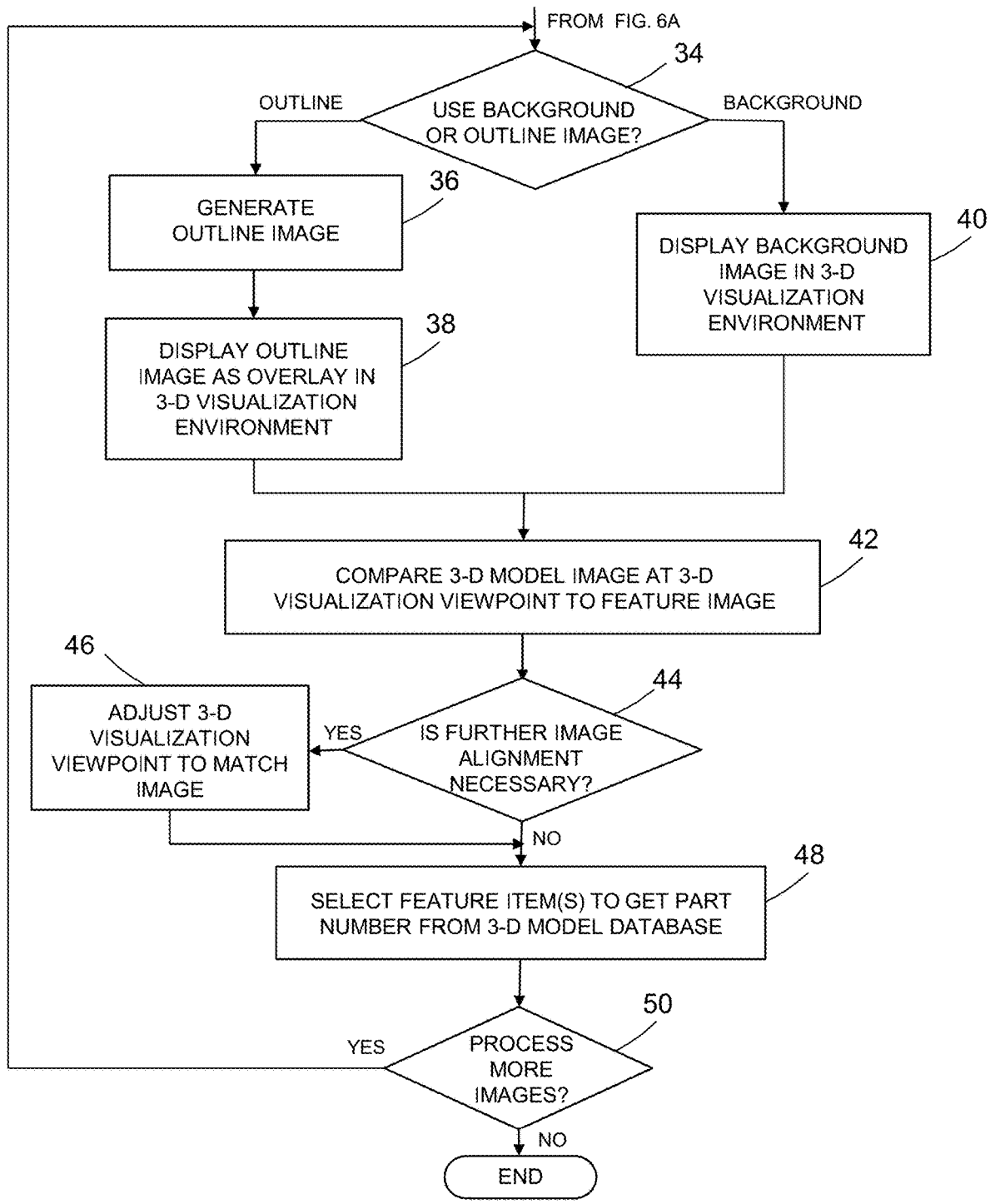

The steps of a part identification process 18 in accordance with one embodiment are summarized in the flowchart presented in FIGS. 6A and 6B. Referring to FIG. 6A, the reference image is acquired while the imaging device 4 (e.g., a camera) is at a known initial location 6 relative to the coordinate system of the target object (step 20). Then, the user moves to an unknown location (hereinafter "subsequent location 8") and a feature image is acquired while the imaging device 4 is at the unknown subsequent location 8 relative to the coordinate system of the target object (step 22). A decision is then made whether additional feature images are to be acquired or not (step 24). If additional feature images are desired, the process returns to step 22. If additional feature images are not wanted, image acquisition is terminated and the acquired reference and feature images are sent from the imaging device to a computer system (e.g., an off-site expert's workstation situated at a maintenance operations center) that hosts a 3-D visualization software application 70 (step 26). First, the computer system uses the relative location data (which may be stored in the image metadata) to compute the viewpoint location of each feature image relative to the viewpoint of the reference image using coordinate transformations (step 28). This viewpoint location is then sent to the 3-D visualization application 70 (step 30). In addition, a 3-D model of the target object is loaded into the 3-D visualization application 70 (step 32).

Referring to FIG. 6B, a decision is then made by the expert whether to use a background image mode or an outline image mode (step 34). If the expert selects the outline image mode, an edge detection software application is used to generate an outline (or semi-transparent) feature image (step 36) and then that image is displayed as an overlay in the 3-D visualization environment (step 38). The expert then compares the 3-D model image at the 3-D visualization viewpoint location to the outline feature image (step 42). Alternatively, if the expert selects the background image mode, the feature image is displayed as a background image in the 3-D visualization environment (step 40). The expert then compares the 3-D model image at the 3-D visualization viewpoint location to the background feature image (step 42). A determination is then made by the expert whether further image alignment is desirable or not (step 44). If further image alignment is desirable, then the expert can adjust the 3-D environment viewpoint to match the feature image (step 46). If the alignment of the 3-D model image and feature image is satisfactory, then no adjustment is needed.

It is also possible to use an automatic technique to do the fine alignment adjustment. Such an automatic alignment technique may involve the use of image processing methods, such as edge detection of the virtual image, and/or a method to reduce the difference between the edges detected in the feature photograph and the edges detected in the virtual image. This is likely to be an iterative type of solution. Iterative types of solutions like this need an initial location estimate that is relatively close to final solution to have a chance of succeeding in a reasonable amount of time. The initial location estimate provided by the IMU 60 is suitable for use in an iterative alignment process.

Once the images are properly aligned, the aligned images can be used to select an area in the 3-D model image in order to retrieve part identification data (i.e., an identification number for a part on or under the surface of the selected area) from the 3-D model database 68 (step 48). The expert then decides whether more images should be processed (step 50). If the user decides that another image should be processed, the process returns to step 34. If the user decides to not process another image, process 18 is terminated.

Figure 7A:
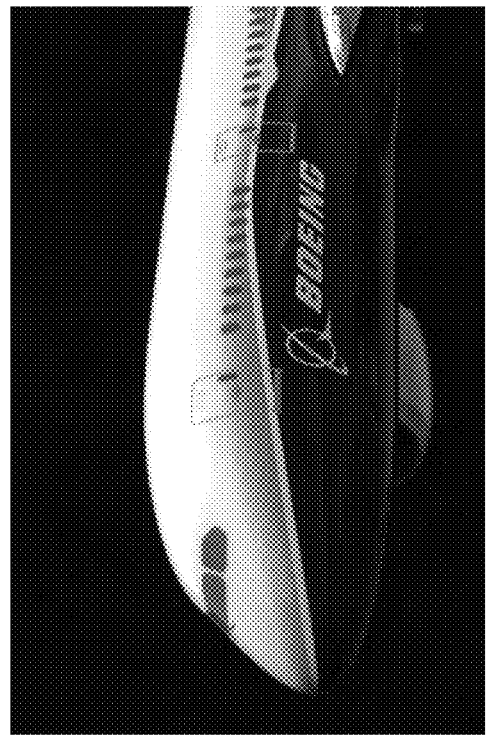
FIGS. 7A and 7B are representations of simulated on-site photographs showing an image (FIG. 7A) captured while the camera is at than initial location and an image (FIG. 7B) captured while the camera is at a subsequent location.
Figure 7B:
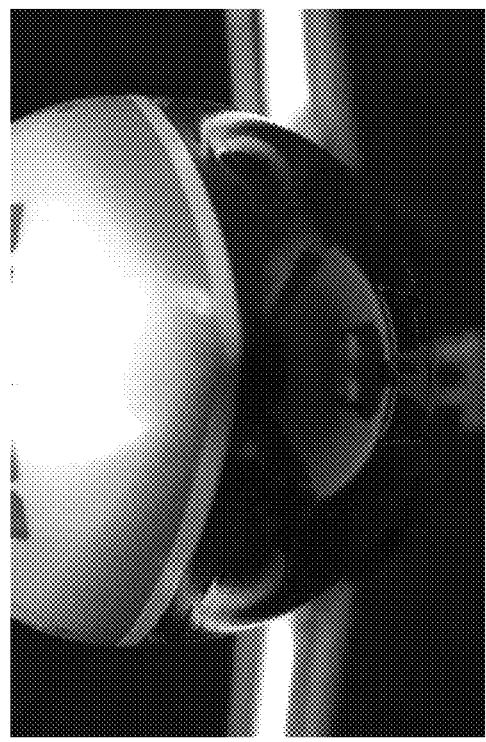

FIGS. 7A and 7B are representations of simulated on-site photographs showing a reference image (FIG. 7A) captured while the camera is positioned and oriented at the initial location 6 in FIG. 1, and a feature image (FIG. 7B) captured while the camera is positioned and oriented at the subsequent location 8 in FIG. 1. The reference image may be used as an overlay in the initial alignment process to confirm that the reference image was properly captured by the user and if it turns out to be slightly misaligned, the image device user or the expert analyst may adjust the viewpoint in the 3-D visualization application 70 and record the corrected initial location.

In some situations, the digital image files corresponding to the images seen in FIGS. 7A and 7B are sent to an off-site expert for analysis. In other situations, the digital image files are used at the on-site location (and potentially on the computing device used to capture the image data and metadata, if it has the required processing and graphics capabilities). The digital image files are loaded into an application program that computes the Cartesian coordinates of the subsequent location 8 relative to the coordinate system {1} (which has a known location relative to the airplane coordinate system) by using the metadata stored in the reference and feature image files. If the initial location 6 does not coincide with the origin of the airplane's coordinate system, then an additional coordinate system transformation (such as the transformation indicated by the equation in FIG. 2) should be performed to establish the location of the coordinate system (2) relative to the coordinate system of the airplane. When completed, this process provides location data defined in the local coordinate system of the airplane.

Figure 8B:
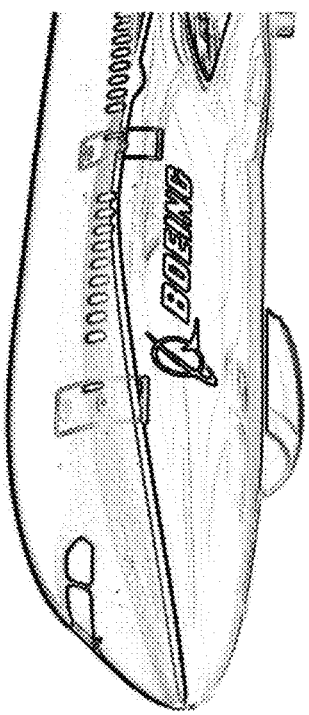
FIGS. 8A through 8D present respective views of the front end of an airplane which can be displayed using a 3-D visualization process, such views including: (a) a 3-D model before setting the viewpoint (FIG. 8A); (b) an overlay outline feature image (FIG. 8B); (c) a 3-D model with an overlay image and with the viewpoint set (FIG. 8C); and (d) a 3-D model at a proper viewpoint with the overlay turned off (FIG. 8D).
Figure 8D:
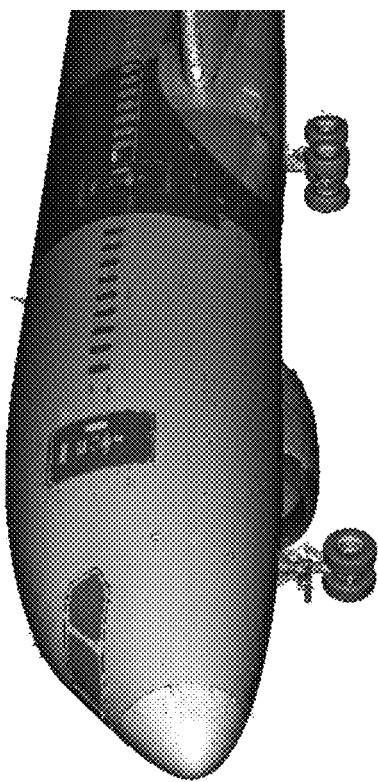
Figure 8A:
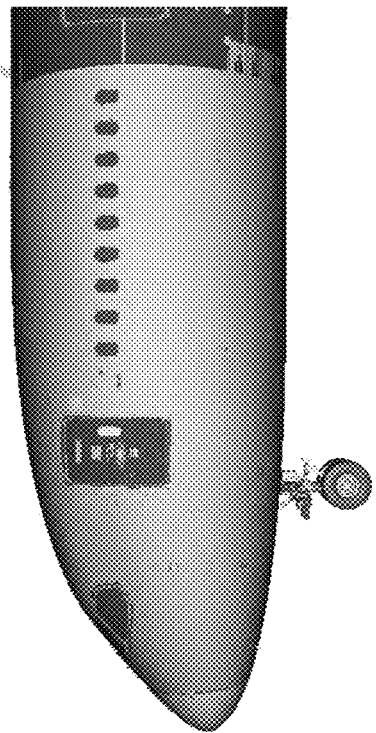

This relative location data, which is defined in the coordinate system of the airplane (or other target object), is then used by the 3-D visualization application 70 to set position and orientation of the virtual viewpoint, along with the camera's field-of-view setting from the feature photograph metadata. First, the imaging device user or expert analyst loads a stored 3-D model into the 3-D visualization application 70. FIG. 8A shows a view of the visualization interface after loading of a 3-D model and before setting the viewpoint. The 3-D visualization application 70 then sets the position and orientation of the virtual viewpoint using the relative location data. This combination of computed viewpoint and 3-D models displayed in the virtual environment produces an approximate viewpoint location of where the feature photograph was taken defined in terms of the target object coordinate system. The imaging device user or expert analyst may then load the feature image file into the 3-D visualization application 70 as a background or overlay image. If the overlay option is desired, the system can produce a semi-transparent outline feature image using edge-detection techniques. Such an outline feature image is shown in FIG. 8B. The imaging device user or expert analyst may then overlay the outline feature image onto a 3-D image of the airplane 10 having a viewpoint set using the metadata, as shown in FIG. 8C, and then compare the set viewpoint to the outline feature image, and if necessary, perform minor location adjustments to the virtual viewpoint to precisely align the 3-D model image with the outline feature image.

As an example of how the method works, a small-scale 3-D model of an airplane (shown in FIG. 8A) was used to simulate the full-scale airplane. An outline image was generated from the photographs (FIG. 8B) and overlaid onto the 3-D model (FIG. 8C), after which minor translation/rotation adjustments of the 3-D viewpoint were performed to refine the alignment. FIG. 8D shows a view of the visualization interface displaying the 3-D model image with the proper viewpoint and with the overlay turned off.

Figure 8C:
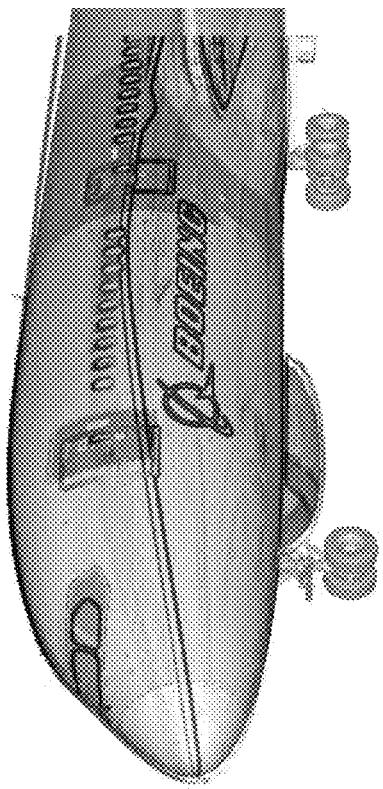

When the 3-D viewpoint of the 3-D model in the virtual environment is aligned with the background or overlay photograph (as shown in FIG. 8C), the imaging device user or expert analyst can select the 3-D model part of interest and acquire the part identification number or other part information from the 3-D model data or model database. On some occasions, it may be obvious which part of photograph contains the feature of interest (which allows for straightforward part selection), especially if the photograph is showing an anomaly, but in other situations the area of interest may not be as clear to the user. There are several options to address this, including using a central reticle (e.g., crosshair) in the 3-D display that indicates where the imaging device 4 was aimed, another approach may be to have the imaging device user draw a circle around the part of interest before the feature image is captured. These visual elements can then be used by the imaging device user or expert analyst to assist in the interactive part selection process.

The above-described method includes a calculation of the orientation offset of the subsequent location relative to the initial location of the imaging device 4. The heading angle difference when the imaging device 4 is at the subsequent location 8 as compared to the initial location 6 can be computed using subtraction as follows:

$$\Delta h = \text{heading2} - \text{heading1} \quad (1)$$

where heading1 and heading2 are the respective heading angles of the imaging device 4 at the initial location 6 and subsequent location 8. The X and Y position offsets and the heading angle difference may be used to generate a homogeneous transformation matrix that represents the location (position and orientation) offset between the initial location 6 and the subsequent location 8 as follows:

$$T = \begin{bmatrix} \cos(\Delta h) & -\sin(\Delta h) & 0 & \Delta x \\ \sin(\Delta h) & \cos(\Delta h) & 0 & \Delta y \\ 0 & 0 & 1 & \Delta z \\ 0 & 0 & 0 & 1 \end{bmatrix} \quad (2)$$

In the scenario represented by the vector diagram in FIG. 1, the transformation matrix T in Eq. (2) is $_2^1T$, which transforms the location in coordinate system {2} into a corresponding location in the coordinate system {1} and can be computed as follows:

$$_2^1T = {_1^0T}^{-1} {_2^0T} \quad (3)$$

where $_1^0T$ is the transformation matrix which transforms the location in coordinate system {1} into a corresponding location in the coordinate system {0}), and $_2^0T$ is the transformation matrix which transforms the location in coordinate system {2} into a corresponding location in the coordinate system {0}. The resulting transformation matrix $_2^1T$ can be used in the form shown in Eq. (3), or in other equivalent formats, to set the virtual camera viewpoint in a 3-D virtual environment.

Note that FIG. 1 shows the ideal situation where the camera location for the reference photograph is aligned with the origin of the coordinate system of the airplane 10, but it may not always be possible to capture the reference photograph at this location. In situations where the initial location 6 does not coincide with the origin of the coordinate system of the target object, an additional transformation multiplication can be used to perform this alignment.

For the avoidance of doubt, the innovative methodology proposed herein may be characterized as both a method for displaying a three-dimensional model image of a portion of a target object, a method for determining 3-D coordinates of a part of a target object, and a method for identifying a part of a target object. The method for displaying a three-dimensional model image of a portion of a target object in accordance with one embodiment includes the following steps: (a) carrying an imaging device from an initial location that is known in a frame of reference of the target object to a subsequent location that is not known in the frame of reference of the target object while walking along a path, wherein an area on the target object including a part of interest is in the field-of-view of the imaging device when the imaging device is at the subsequent location; (b) acquiring orientation data representing an orientation of the imaging device during walking along the path using an inertial measurement unit incorporated in the imaging device; (c) acquiring vertical acceleration data during walking along the path (to be interpreted as walking steps) using the inertial measurement unit; (d) counting the number of walking steps taken during walking along the path by detecting a repeating characteristic of the vertical acceleration data; (e) calculating a current position and a current orientation for the subsequent location of the imaging device relative to the frame of reference of the target object using the orientation data, the number of walking steps, and a step length; and (f) displaying a three-dimensional model image of at least a portion of the target object with a viewpoint that is a function of the calculated current position and current orientation of the imaging device.

The method for determining 3-D coordinates of a part of a target object and identifying a part of a target object in accordance with one embodiment includes steps (a) through (e) set forth in the preceding paragraph and the following additional steps: (g) selecting a point in a portion of the displayed three-dimensional model image that depicts the part of interest; (h) retrieving part identification data from a three-dimensional model database corresponding to the part of interest selected; and (i) displaying alphanumeric symbology that depicts the identity of the part contained in the retrieved part identification data.

The methodology disclosed herein has multiple applications. Various possible use cases are briefly described in the following paragraphs (1)-(3). All of the use cases briefly described below are related scenarios in which the target object (in this case, as airplane) is situated at a geographical coordinate position that may not have acceptable GPS reception (usually indoors). However, nothing in this disclosure should limit the invention solely to indoor use.

(1) In a first use case, a service technician is assigned the task of extracting assembly information and part numbers for a damaged area on an airplane. The service technician (or someone instructed by the service technician) would take digital photographs of the damaged area on the airplane and send them to an expert analyst for review. Using the methodology described above, the expert analyst can identify the parts appearing in the photograph by matching the damage location with a 3-D model for that same area. Currently, that matching activity is highly related to the level of experience of the expert analyst and his/her capability to extract data with little or no reference from the existing support datasets (manuals, technical drawings and similar documentation).

(2) In a second use case, an airline mechanic is making a walk-around check of the airplane between two flights and spots a potential problem area that needs to be addressed within a specific allotted time. Two options exist in that case depending on the severity of the problem at hand: immediate action or sending a service request to the airplane manufacturer. In both cases, taking digital location-tagged photographs will enable a person in front of the airplane to immediately relate the camera location to a 3-D model of the airplane, assuming the device has the 3-D model dataset installed and is capable of displaying the 3-D model data. If not, sending the photographs to an expert analyst for a quick review is the second option and by using the methodology disclosed herein, it is possible to obtain quick feedback on the severity of the problem.

(3) In a third use case, a pre-delivery inspection (i.e., quality control) technician at a delivery center performs an outside check of the airplane and spots some discrepancy, whether it is technical or in appearance. An inspection is scheduled in a not distant time frame, so there is limited time for corrective action. The technician takes the location-tagged photographs and launches a 3-D model visualization session to compare the photographs to that specific airplane line number 3-D model. Interrogation helps the identification of the troubled part(s) and the new part is immediately located and sourced for a replacement of the defective one.

In accordance with some embodiments, the method comprises: acquiring reference image data and first heading angle data using an imaging device directed toward the target object and located at a known initial location relative to a coordinate system of the target object; measuring the heading angle at the start of each step and counting the number of steps as the user walks from the known initial location to an unknown subsequent location 8; and then acquiring feature image data using the imaging device directed toward an area of interest on the target object and located at the unknown subsequent location relative to the coordinate system of the target object. Then, a Cartesian coordinate offset is computed between the subsequent location and the initial location, wherein the offset is a function of the number of steps taken and the heading angles at the start of each step. Thereafter, three-dimensional model data of the target object is retrieved from a three-dimensional model database and a three-dimensional model image of at least a portion of the target object is displayed with a viewpoint that is a function of the computed position offset and the heading angle of the field-of-view of the imaging device. A feature image of the same portion of the target object is concurrently displayed as an overlay or background to the three-dimensional model image, the feature image representing at least portions of the feature image data. The displayed feature image may comprise an outline extracted from the feature image data using edge detection. The user can adjust a position of the three-dimensional model image to align it with the feature image on the display screen. If the images are properly aligned, the user may select a point in the displayed feature image based on the damage shown in the feature image. The processor is configured to retrieve additional three-dimensional model data from the three-dimensional model database in response to the selection. Symbology (e.g., alphanumeric symbols) representing the retrieved additional three-dimensional model data is displayed on the display screen. The additional three-dimensional model data may include part identification data that identifies a part of the target object associated with an area of the three-dimensional model image containing the selected point and/or coordinates of the selected point in the coordinate system of the target object.

In summary, the methodology disclosed above comprises the following features: (1) the location data is defined in the local coordinate system of the target object; (2) the method uses consumer level hardware for image capture and relative localization data acquisition; and (3) the processing results integrate with 3-D modeling applications to set a viewpoint to allow part selection.

Some elements of the method disclosed above include the following:

(1) Calibration of the imaging device to the target object is accomplished using a dead-reckoning method and camera setting information.

(2) The coordinates of the location of an item of interest are converted into target object coordinates using coordinate system transformation processes.

(3) A virtual camera in a 3-D visualization environment may be moved to a calculated location and the field-of-view of the virtual camera can be set to match the photograph;

(4) A 3-D visualization environment is used to interactively re-adjust the viewpoint of the virtual camera, if needed.

(5) An expert analyst may use this view of the 3-D models to select feature locations to determine associated part numbers.

The solution presented here is intended to work with consumer level hardware that will likely be available on-site, and can be used with minimal training. The only requirement beyond knowing how to take a digital photograph is that the on-site person takes a reference photograph of some identifiable part of the target object. This approach greatly simplifies the process compared to other measurement-based systems. The method described here provides a reasonably good initial estimate of the alignment location, with only minor adjustments needed (if at all). With this methodology, a user may manipulate the viewpoint of a 3-D model instead of walking around a physical space. Walking around in the physical space may be difficult to do when limitations in the physical environment (like obstacles or height constraints) preventing the user from reaching the required alignment location. Once the location-tagged photographs have been acquired on site, the analysis can take place at a later time and at a different location with a 3-D visualization-capable device. Further access to the physical target object is not required.

Advanced versions of the system disclosed herein may include loading the 3-D visualization application into the imaging device, which would enable on-site analysis personnel to perform any task that requires 3-D visualization. In addition, an estimated region of uncertainty may be displayed on the 3-D model.

The above-described method uses a dead-reckoning process with acceleration and orientation data from an IMU and a step counting computation to compute a relative position estimate that does not suffer from position drift. Also, part of the method may include an adaptive correction of translation data by using a 3-D model overlay based on user input. In accordance one embodiment, the method includes: (a) acquiring feature image data while the area on the target object including the part of interest is in the field-of-view of the imaging device; (b) displaying a feature image corresponding to the acquired feature image data as an overlay or background to the three-dimensional model image; and (c) adjusting the viewpoint until the three-dimensional model image being displayed matches the feature image. The user may directly adjust (e.g., move) the viewpoint or a semi-automated process may provide variations of the current view that the user may select as a suitable match. One example is a process that produces images from positions that are in various orbits (rings) around the initial viewpoint and allows either the user to select a suitable fit or a processor automatically selects the image with an acceptable variance between the acquired image of the target object and the image retrieved from a 3-D model of the target object. The difference between the initially computed location and corrected location can be used to refine the mathematical model of the walking gait for individual users.

Figure 9:
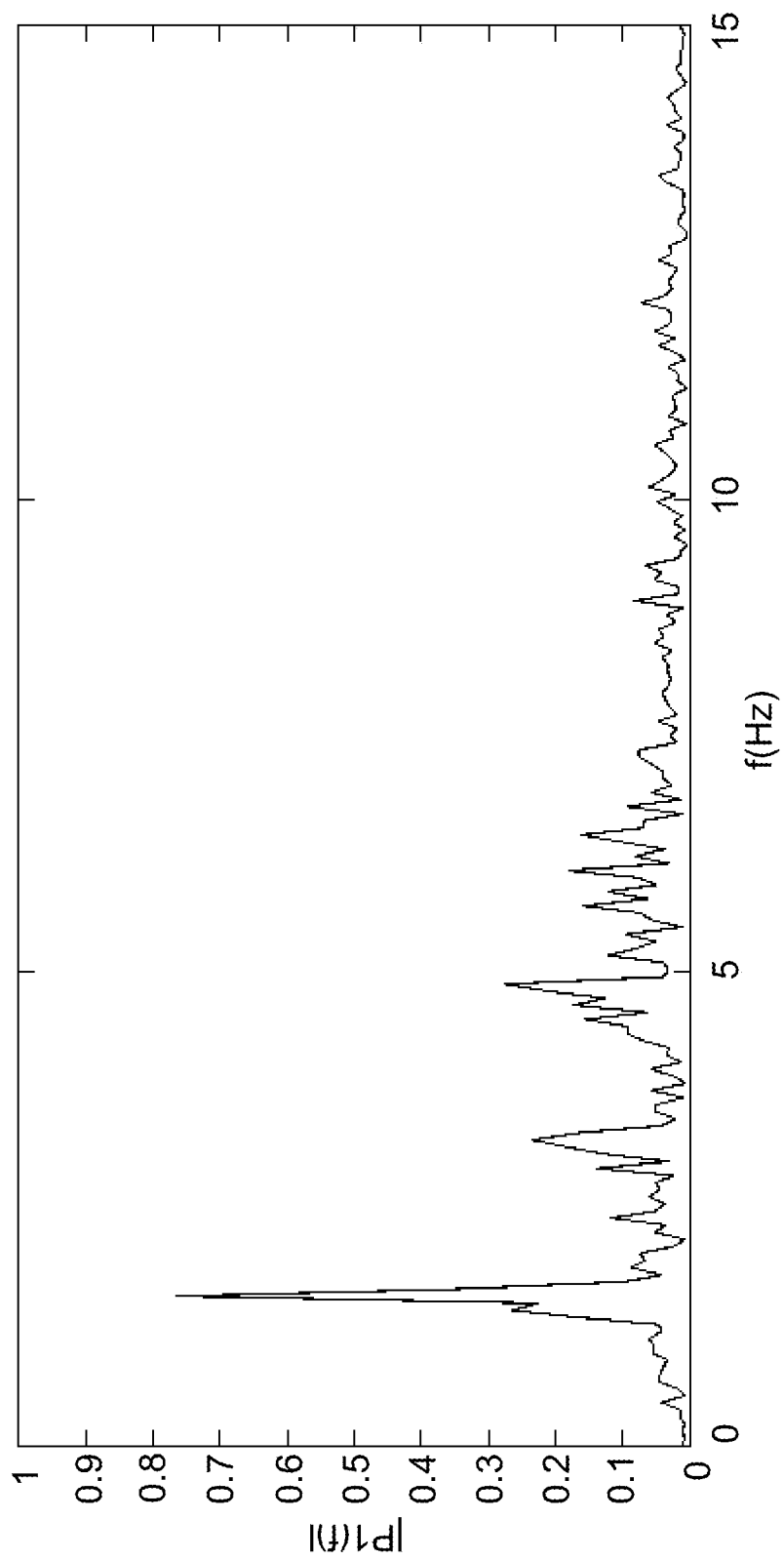
FIG. 9 is a graph showing a single-sided amplitude spectrum of vertical acceleration computed from actual data acquired during a walk by a user.

An additional post-processing correction using Fast Fourier Transform (FFT) analysis of the acceleration data may be used to compute an updated estimate of gait cycle step frequency (also known as step rate, described in steps per unit time) to further refine the model using the relationship between step length and step frequency (which may be normalized for other anthropometric factors such as height) commonly referred to as the "walk ratio". (The walk ratio, step length divided by step frequency, is a speed-independent index of human walking patterns which is known to be constant or nearly constant.) More specifically, the FFT computed step frequency is used to adjust the step length variable, based on the walk ratio. In some embodiments, the walk ratio (acquired from a table lookup indexed by anthropometric data) and step frequency information may be used to provide a reasonable estimate of the step length, which can be used as an alternative to performing the step length calibration process. The FFT takes in data points of the waveform depicted in FIG. 4 and computes the actual step frequency, which may then be used to adjust the step length to correct for possible variations of the step length during walking. FIG. 9 shows an FFT plot generated using actual walking data. This plot is showing the peak amplitude at about 1.5 Hz. By knowing that frequency and the walk ratio, the processor incorporated in the imaging device is able to compute the average step length for this data sample.

The FFT-based correction method can also adjust for some levels of inconsistent motion of the device between the initial and subsequent locations. But if the user's motion is too inconsistent, the application can provide feedback to the user to give an indication of how to improve the user's ability produce motion that is acceptable for the localization process. To achieve this, the application may have an on-screen feedback indication of how well the tracked motion followed the guidelines (e.g., by providing a type of motion "score"). Together, these corrections can provide the system with adjustments to produce a more accurate position estimate.

To summarize the preceding paragraph, the method for displaying a three-dimensional model image of a portion of a target object may include a correction process comprising the following steps: using FFT analysis of the acceleration data to compute an updated estimate of gait cycle step frequency; refining a mathematical model of the dead-reckoning process using a walk ratio and the updated estimate of gait cycle step frequency; detecting a deviation of the user's actual step length from the step length acquired during calibration; and displaying symbology on a display screen of the imaging device to indicate an amount of the deviation.

In an alternative embodiment, the imaging device has a stand-alone offset computation application and does not have a 3-D visualization application. Such a device could be used to give users of smartphones (or other imaging devices without 3-D visualization capabilities) an on-the-spot estimate of the coordinates of the feature of interest on the target object, which could be used to provide approximate relative position measurements.

Embedding the offset computation function into the 3-D visualization application is considered to be the most seamless approach if the developer has access to the source code for the 3-D visualization application. If the developer does not have access—such as someone (non-developer) who wants to use it with a commercial off-the-shelf (COTS) 3-D visualization application—some type of plug-in approach would be another option. Some applications have externally accessible application program interfaces (APIs) that allow users to connect to other applications (using plug-ins or add-in modules, etc.), but for those applications that do not have that type of interface, the developer can still use the concept by having a separate stand-alone offset computation application that computes the offset transformation matrix and saves it to a file, which file can be loaded by the user into the 3-D visualization application.

With respect to using 3-D graphics without location assistance of the type provided here, the difficulty in finding a specific part in a 3-D visualization environment should not be underestimated. For large objects like airplanes, an expert analyst working with photographs as a visual input might not even know which side of an airplane is being shown, or which one of potentially dozens of similar parts located in different positions around the airplane are in the view. Even when photographs can be used as an overlay, it is still very challenging to align the 3-D view with the photograph, since separate adjustments such as dolly and zoom have similar visual effects on the view, but end up with different positioning results. Working to achieve a reasonable solution in this manner is iterative and can be very tedious.

While this disclosure has focused mainly on airplane-related tasks, it is not limited to that specific field. Other manufacturing, architectural, and construction applications that use 3-D models could take advantage of this concept.

As mentioned earlier, the method disclosed herein benefits areas such as: flight line operations, airplane-on-ground situations and inspections. Assessing an airplane for repairs or during an accident investigation may involve analysis of multiple digital photographs taken by people who are not experts in 3-D modeling, which can cause difficulties with current processes in identifying parts, since it can be challenging without proper location context. But, with the process described herein, those photographs can be sent to experts to help determine which parts are involved, even when the location context is not clear using pure visual inspection. The ability to use a series of images with embedded location and camera setting data, acquired by a variety of on-site witnesses with common consumer-level equipment (e.g., a typical smartphone), to provide relative location information, can reduce travel costs and increase the quantity of useful data available for analysis.

While apparatuses and methods for displaying a three-dimensional model image of a portion of a target object and for identifying parts visible in a captured image of an area of interest on a target object have been described with reference to various embodiments, it will be understood by those skilled in the art that various changes may be made and equivalents may be substituted for elements thereof without departing from the teachings herein. In addition, many modifications may be made to adapt the concepts and reductions to practice disclosed herein to a particular situation. Accordingly, it is intended that the subject matter covered by the claims not be limited to the disclosed embodiments.

As used in the claims, the term "computer system" should be construed broadly to encompass a system having at least one computer or processor, and which may have multiple computers or processors that communicate through a network or bus. As used in the preceding sentence, the terms "computer" and "processor" both refer to devices comprising a processing unit (e.g., a central processing unit (CPU), an integrated circuit or an arithmetic logic unit). For example, the principal components of a CPU include an arithmetic logic unit (ALU) that performs arithmetic and logic operations, processor registers that supply operands to the ALU and store the results of ALU operations, and a control unit that controls the retrieval of instructions (from a non-transitory tangible computer-readable storage medium) and the execution of those instructions by directing the coordinated operations of the ALU, registers and other components.

The methods described herein may be encoded as executable instructions embodied in a non-transitory tangible computer-readable storage medium, including, without limitation, a storage device and/or a memory device. Such instructions, when executed by a processing or computing system, cause the system to perform at least a portion of the methods described herein.

As used in the claims, the term "location" comprises position in a three-dimensional coordinate system and orientation relative to that coordinate system.

The process claims set forth hereinafter should not be construed to require that the steps recited therein be performed in alphabetical order (any alphabetical ordering in the claims is used solely for the purpose of referencing previously recited steps) or in the order in which they are recited unless the claim language explicitly specifies or states conditions indicating a particular order in which some or all of those steps are performed. Nor should the process claims be construed to exclude any portions of two or more steps being performed concurrently or alternatingly unless the claim language explicitly states a condition that precludes such an interpretation.

The invention claimed is:

1. A method for displaying a three-dimensional model image of a portion of a target object, comprising:
   (a) carrying an imaging device from an initial location that is known in a frame of reference of the target object to a subsequent location that is not known in the frame of reference of the target object while walking along a path, wherein an area on the target object including a part of interest is in a field-of-view of the imaging device when the imaging device is at the subsequent location;
   (b) acquiring orientation data representing an orientation of the imaging device during walking along the path using an inertial measurement unit incorporated in the imaging device;
   (c) acquiring vertical acceleration data during walking along the path using the inertial measurement unit;
   (d) counting a number of walking steps taken during walking along the path by detecting a repeating characteristic of the vertical acceleration data;
   (e) calculating a current position and a current orientation for the subsequent location of the imaging device relative to the frame of reference of the target object using the orientation data, the number of walking steps, and a step length; and
   (f) displaying a three-dimensional model image of at least a portion of the target object with a viewpoint that is a function of the calculated current position and current orientation of the imaging device.

2. The method as recited in claim 1, further comprising:
selecting a point in a portion of the displayed three-dimensional model image that depicts the part of interest;
retrieving part identification data from a three-dimensional model database corresponding to the part of interest selected; and
displaying alphanumeric symbology that depicts the identity of a part contained in the retrieved part identification data.

3. The method as recited in claim 1, further comprising:
acquiring feature image data while the area on the target object including the part of interest is in the field-of-view of the imaging device;
displaying a feature image corresponding to the acquired feature image data as an overlay or background to the three-dimensional model image; and
adjusting the viewpoint until the three-dimensional model image being displayed matches the feature image.

4. The method as recited in claim 3, wherein the displayed feature image comprises an outline extracted from the feature image data using edge detection.

5. The method as recited in claim 1, wherein step (e) comprises computing an offset transformation matrix that represents position and orientation offsets of the subsequent location relative to the initial location.

6. The method as recited in claim 5, wherein the position offset is determined using a dead-reckoning process.

7. The method as recited in claim 5, wherein the position offset is determined by executing a dead-reckoning algorithm that combines the orientation data from the inertial measurement unit with walking step information to produce a piecewise linear approximation of the path for relative motion measurement.

8. The method as recited in claim 1, wherein step (d) comprises detecting successive vertical acceleration maxima above a specified threshold in the vertical acceleration data, the count being incremented by unity each time a vertical acceleration maximum is detected.

9. The method as recited in claim 8, wherein step (e) comprises using orientation data acquired at instants in time when the successive vertical acceleration maxima above a specified threshold occurred.

10. The method as recited in claim 1, wherein step (d) comprises detecting successive vertical acceleration minima below a specified threshold in the vertical acceleration data, the count being incremented by unity each time a vertical acceleration minimum is detected.

11. The method as recited in claim 10, wherein step (e) comprises using orientation data acquired at instants in time when the successive vertical acceleration minima below a specified threshold occurred.

12. The method as recited in claim 1, further comprising initial determination of the step length by:
   (g) carrying the imaging device while walking along a substantially straight path having a known length;
   (h) repeatedly acquiring vertical acceleration data during walking along the straight path using the inertial measurement unit;
   (i) counting the number of walking steps taken during walking along the straight path by detecting a repeating characteristic of the vertical acceleration data;
   (j) calculating the step length during the walk along the straight path by dividing the known length by the number of walking steps counted in step (i); and
   (k) storing the step length in a non-transitory tangible computer-readable storage medium, wherein steps (g) through (k) are performed prior to step (a).

13. The method as recited in claim 1, wherein steps (b)-(f) and (h)-(j) are performed by the imaging device.

14. The method as recited in claim 1, wherein steps (d), (e), (i), and (j) are performed by a computer system which receives the orientation data and the vertical acceleration data from the imaging device.

15. A method for identifying a part of a target object, comprising:
   (a) carrying an imaging device from an initial location that is known in a frame of reference of the target object to a subsequent location that is not known in the frame of reference of the target object while walking along a path, wherein an area on the target object including a part of interest is in a field-of-view of the imaging device when the imaging device is at the subsequent location;

(b) executing a dead-reckoning algorithm that combines orientation data from an inertial measurement unit incorporated in the imaging device with walking step information to produce a piecewise linear approximation of the path for measurement of motion of the imaging device relative to the initial location;

(c) calculating a current position and a current orientation for the subsequent location of the imaging device relative to the frame of reference of the target object using the measurement of the motion of the imaging device relative to the initial location;

(d) displaying a three-dimensional model image of at least a portion of the target object with a viewpoint that is a function of the calculated current position and current orientation of the imaging device;

(e) selecting a point in a portion of the displayed three-dimensional model image that depicts the part of interest;

(f) retrieving part identification data from a three-dimensional model database corresponding to the part of interest; and (g) displaying alphanumeric symbology that depicts the identity of the part of interest contained in the retrieved part identification data.

16. The method as recited in claim 15, further comprising:
acquiring feature image data while the area on the target object including the part of interest is in the field-of-view of the imaging device;
displaying a feature image corresponding to the acquired feature image data as an overlay or background to the three-dimensional model image; and
adjusting the viewpoint until the three-dimensional model image being displayed matches the feature image.

17. The method as recited in claim 15, further comprising acquiring vertical acceleration data during walking along the path using the inertial measurement unit, wherein executing the dead-reckoning algorithm comprises counting a number of walking steps taken during walking along the path by detecting a repeating characteristic of the vertical acceleration data.

18. The method as recited in claim 15, wherein steps (b) and (c) are performed by a processor incorporated in the imaging device.

19. The method as recited in claim 15, wherein steps (b) and (c) are performed by a computer system external to the imaging device.

20. An apparatus comprising a digital camera, an inertial measurement unit, a display screen, a non-transitory tangible computer-readable storage medium storing three-dimensional model data of a target object, a three-dimensional visualization software application, and a dead-reckoning algorithm, and a processor configured to perform the following operations:

(a) counting a number of walking steps taken by a user carrying the apparatus during walking along a path from an initial location to a subsequent location by detecting a repeating characteristic of vertical acceleration data acquired by the inertial measurement unit;

(b) calculating a current position and a current orientation for the subsequent location of the digital camera relative to a frame of reference of the target object using the dead-reckoning algorithm, orientation data acquired by the inertial measurement unit, the number of walking steps, and a step length;

(c) retrieving the three-dimensional model data of the target object from the non-transitory tangible computer-readable storage medium; and (d) using the three-dimensional visualization software application to control the display screen to display a three-dimensional model image of at least a portion of the target object with a viewpoint that is a function of the calculated current position and current orientation of the imaging device, the three-dimensional model image depicting three-dimensional model data retrieved from a three-dimensional model database.

21. The apparatus as recited in claim 20, wherein the processor is further configured to use the three-dimensional visualization software application to control the display screen to display a feature image of the same portion of the target object as an overlay or background to the three-dimensional model image, the feature image representing at least portions of feature image data captured by the digital camera while the apparatus is at the subsequent location.

22. The apparatus as recited in claim 20, wherein operation (b) comprises computing an offset transformation matrix that represents position and orientation offsets of the subsequent location relative to the initial location.

23. The method as recited in claim 6, further comprising:
using Fast Fourier Transform analysis of the acceleration data to compute an updated estimate of gait cycle step frequency; and
refining a mathematical model of the dead-reckoning process using a walk ratio and the updated estimate of gait cycle step frequency.

24. The method as recited in claim 23, further comprising:
detecting a deviation of the user's actual step length from the step length used in step (a); and
displaying symbology on a display screen of the imaging device to indicate an amount of the deviation.

* * * * *